United States Patent [19]
Park et al.

[11] Patent Number: 6,083,796
[45] Date of Patent: Jul. 4, 2000

[54] SEMICONDUCTOR DEVICE AND METHOD FOR FABRICATING THE SAME

[75] Inventors: Sung Kye Park; Eun Jeong Shin, both of Chungcheongbuk-do, Rep. of Korea

[73] Assignee: LG Semicon Co., Ltd., Cheongju, Rep. of Korea

[21] Appl. No.: 09/118,812

[22] Filed: Jul. 20, 1998

[30] Foreign Application Priority Data

Feb. 4, 1998 [KR] Rep. of Korea .................. 98/3067

[51] Int. Cl.[7] ................................. H01L 21/336
[52] U.S. Cl. ................................. 438/294; 438/305
[58] Field of Search .................... 438/305, 294

[56] References Cited

U.S. PATENT DOCUMENTS

| | | | |
|---|---|---|---|
| 4,700,454 | 10/1987 | Baerg et al. | 437/24 |
| 4,810,664 | 3/1989 | Kamins et al. | 437/26 |
| 5,593,928 | 1/1997 | Lee | 437/41 |
| 5,843,826 | 12/1998 | Hong | 438/300 |
| 5,989,965 | 11/1999 | Maa et al. | |

*Primary Examiner*—Richard Booth
*Attorney, Agent, or Firm*—Fleshner & Kim, LLP

[57] ABSTRACT

A semiconductor device and a method for fabricating the same are disclosed that reduce short channel effects to improve device characteristics. The semiconductor device includes a gate insulating film formed on a semiconductor substrate, a gate electrode formed on the gate insulating film and a lightly doped region formed in the semiconductor substrate at both sides of the gate electrode. A sidewall insulating film is formed at both sides of the gate electrode and a heavily doped impurity region is formed in the semiconductor substrate extending from the sidewall insulating film. Further, an insulating film is formed at sides of the heavily doped impurity region. The insulating film prevents impurity ions from the heavily doped impurity region from diffusing into the channel region of the device.

14 Claims, 9 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device and a method for fabricating the same that reduces a short channel effect.

2. Background of the Related Art

Generally, in fabricating a semiconductor integrated circuit, various efforts continue at reducing the dimensions of a metal oxide semiconductor field effect transistor (MOSFET) constituting a semiconductor chip integrated circuit that has excellent perfomance and high packing density. As a result of such efforts, a semiconductor integrated circuit and a method of making the same have been scaled down to a sub-micron size.

In reducing the dimensions of the semiconductor device, the vertical dimension as well as the horizontal dimension should be reduced to balance the characteristics of various devices. In other words for a transistor, if the distance between a source and a drain becomes close, a characteristic of the device is varied, which causes an undesired characteristic such as the short channel effect. To improve such short channel effects caused by high packing density, a lightly doped drain (LDD) structure is adopted in which a low density junction is formed below a gate sidewall.

A related art semiconductor device and a method for fabricating the same will now be described. FIG. 1 is a diagram showing a sectional view of the related art semiconductor device.

As shown in FIG. 1, a gate insulating film 12 is formed on a semiconductor substrate 11. A gate electrode 13a is formed in a predetermined region on the gate insulating film 12. A sidewall insulating film 16 is formed at both sides of the gate electrode 13a. A heavily doped impurity region 17 having an LDD structure is formed in a surface of the semiconductor substrate 11 at both sides of the gate electrode 13a.

FIGS. 2a to 2d are diagrams showing sectional views of a method for fabricating the related art semiconductor device. As shown in FIG. 2a, a channel ion is implanted into the entire surface of the semiconductor substrate 11. A gate insulating film 12 is formed on the semiconductor substrate 11 into which the channel ion is implanted. A polysilicon layer 13 for a gate electrode is formed on the gate insulating film 12. Subsequently, a photoresist 14 is deposited on the polysilicon layer 13 and then patterned by exposure and developing processes to define a gate region.

As shown in FIG. 2b, the polysilicon layer 13 is selectively removed using the patterned photoresist 14 as a mask to form a gate electrode 13a. As shown in FIG. 2c, the photoresist 14 is removed, and an n type lightly doped impurity ion is implanted into the entire surface of the semiconductor substrate 11 using the gate electrode 13a as a mask to form a lightly doped impurity region 15 in the surface of the semiconductor substrate 11. Thus, the lightly doped impurity region 15 is formed at both sides of the gate electrode 13a.

As shown in FIG. 2d, an insulating film (not shown) is formed on the entire surface of the semiconductor substrate 11 including the gate electrode 13a. The insulating film is then etched back to form a sidewall insulating film 16 at both sides of the gate electrode 13a. Subsequently, an n type heavily doped impurity ion, which is used for a source and a drain, is implanted into the entire surface of the semiconductor substrate 11 using the sidewall insulating film 16 and the gate electrode 13a as masks. A heavily doped impurity region 17, which is connected with the lightly doped impurity region 15, is thereby formed in the surface of the semiconductor substrate 11 at both sides of the gate electrode 13a.

However, the related art semiconductor device and method for fabricating the same have various problems. In the related art semiconductor device and the method for fabricating the same reliability deteriorates because of a short channel effect caused by diffusing impurity ions of the heavily doped impurity region into the channel region.

The above references are incorporated by reference herein where appropriate for appropriate teachings of additional or alternative details, features and/or technical background.

SUMMARY OF THE INVENTION

An object of the present invention is to provide a semiconductor device and a method for fabricating the same that substantially obviate one or more of the problems caused by limitations and disadvantages of the related art.

Another object of the present invention is to provide a semiconductor device and a method for fabricating the same having an insulating film is formed at sides of a heavily doped impurity region.

Another object of the present invention is to provide a semiconductor device and a method for fabricating the same that prevents diffusing of impurity ions of the heavily doped impurity region.

Another object of the present invention is to provide a semiconductor device and a method for fabricating the same that prevents impurity ions of the heavily doped impurity region from diffusing to a channel region.

Another object of the present invention is to provide a semiconductor device and a method for fabricating the same that increases reliability of the device.

To achieve at least these objects and other advantages in a whole or in parts and in accordance with the purpose of the present invention, as embodied and broadly described, a semiconductor device according to the present invention includes a gate insulating film on a prescribed portion of a semiconductor substrate, a gate electrode on the gate insulating film, a lightly doped region in the semiconductor substrate at both sides of the gate electrode, sidewall insulating films formed at both sides of the gate electrode and the gate insulating film, heavily doped impurity regions in the semiconductor substrate extending from a side of the sidewall insulating films opposite the gate electrode, and insulating films positioned at sides of the heavily doped impurity region.

To further achieve the above objects in a whole or in parts, a method for fabricating a semiconductor device is provided according to the present invention that includes the steps of forming insulating films on a semiconductor substrate having prescribed dimensions and separated by a prescribed distance, forming a semiconductor layer on an entire surface of the semiconductor substrate including the insulating films, forming a gate on the semiconductor layer between pairs of the insulating films, forming a lightly doped impurity region in a surface of the semiconductor layer at both sides of the gate, forming a first sidewall insulating film at both sides of the gate, and forming a heavily doped impurity regions in the semiconductor layer at both sides of the gate, the heavily doped impurity region being isolated from each other by the insulating film.

To further achieve the objects in a whole or in parts, a method for fabricating a semiconductor device is provided according to the present invention that includes the steps of forming a gate insulating film and a gate electrode on a semiconductor substrate, etching the semiconductor substrate at both sides of the gate electrode to a predetermined depth from the top surface to form a trench, forming an insulating film on the surface of the semiconductor substrate in the trench, forming a first sidewall insulating film at both sides of the gate electrode, the gate insulating film, and the trench, selectively removing the insulating film using the gate electrode and the first sidewall insulating film as masks, removing the first sidewall insulating film, forming a semiconductor layer on the entire surface of the semiconductor substrate including the insulating film, and forming a heavily doped impurity regions in the semiconductor layer at both sides of the gate electrode, wherein the heavily doped impurity regions are isolated from each other by the insulating film.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
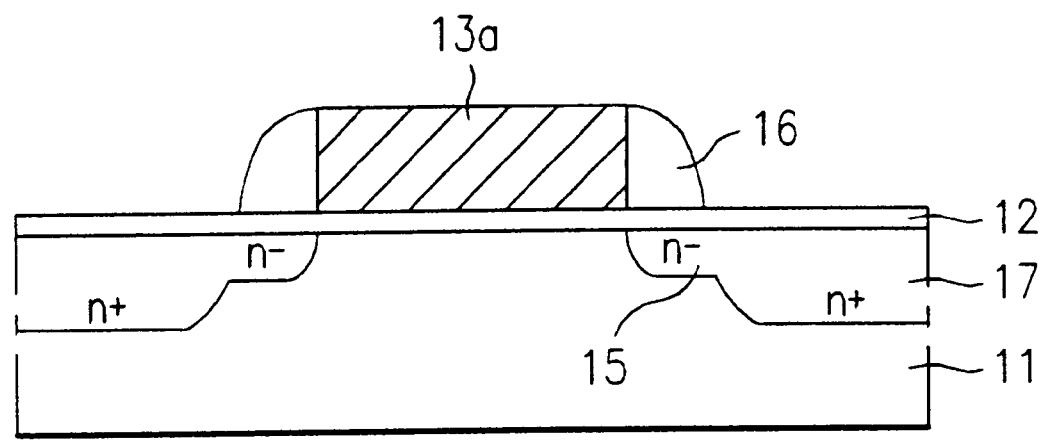
FIG. 1 is a diagram illustrating a sectional view of a related art semiconductor device.
Figure 2A:
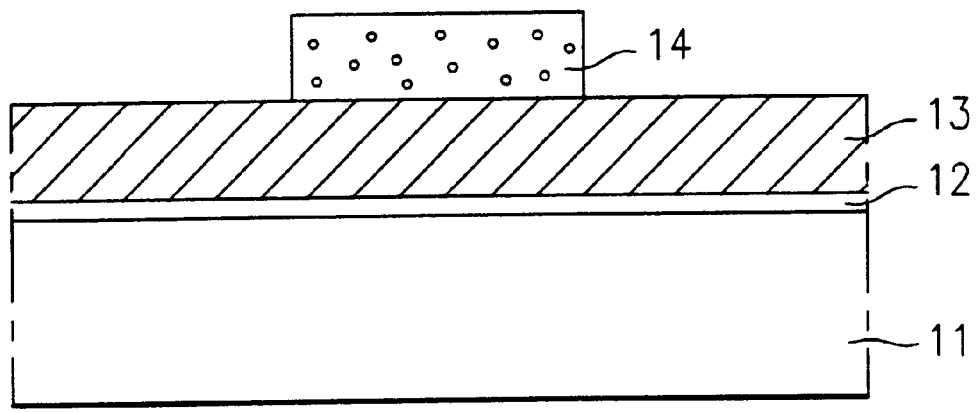
FIGS. 2a to 2d are diagrams illustrating sectional views of process steps of a method for fabricating the related art semiconductor device of FIG. 1.
Figure 2B:
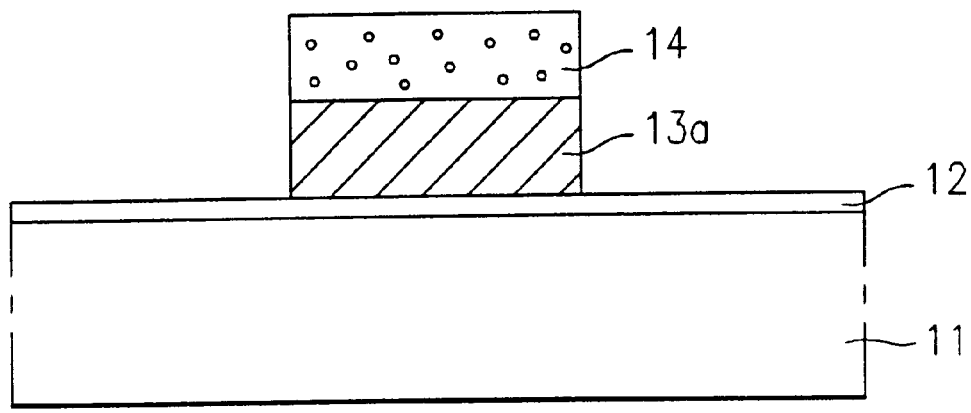
Figure 2C:
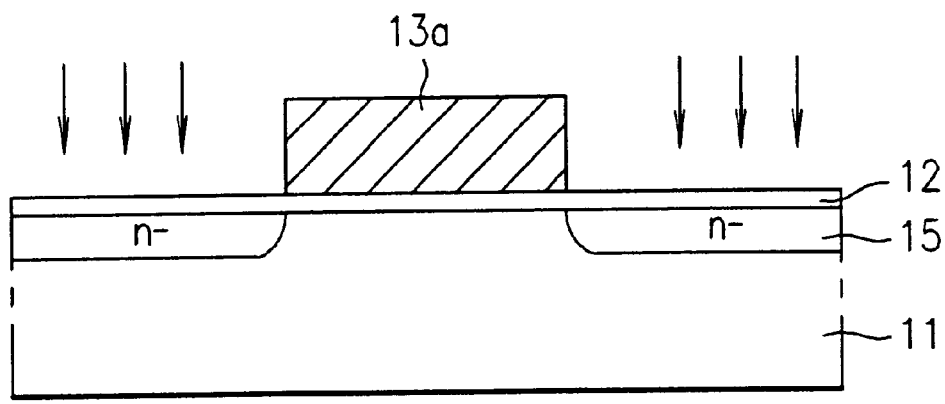
Figure 2D:
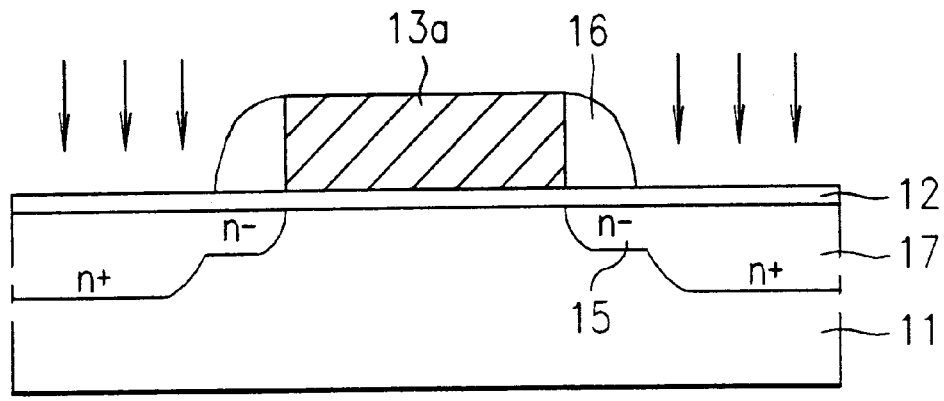
Figure 3:
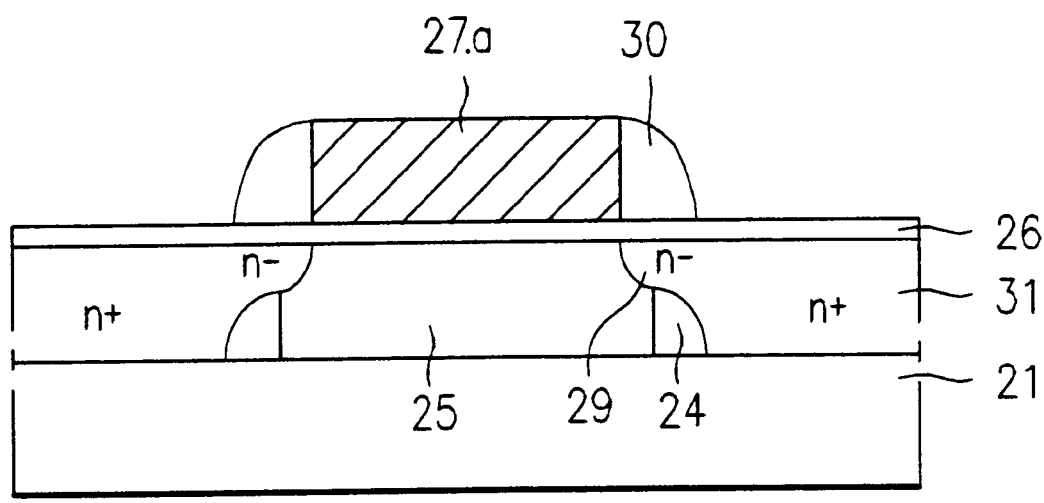
FIG. 3 is a diagram illustrating a sectional view of a preferred embodiment of a semiconductor device according to the present invention.

FIG. 3 is a diagram showing a cross-sectional view of a first preferred embodiment of a semiconductor device according to the present invention. As shown in FIG. 3, the semiconductor device according to the first preferred embodiment includes a gate insulating film 26 formed on a semiconductor substrate 21, a gate electrode 27a formed on the gate insulating film 26, a lightly doped impurity region 29 formed in the semiconductor substrate 21 at both sides of the gate electrode 27a and a sidewall insulating film 30 formed at both sides of the gate electrode 27a. The first preferred embodiment of a semiconductor device further includes a heavily doped impurity region 31 in the semiconductor substrate 21 that extends from a lower portion of the sidewall insulating film 30 and a sidewall oxide film 24 formed at sides of the heavily doped impurity region 31.

FIGS. 4a to 4h are diagrams illustrating sectional views of process steps of a method for fabricating a semiconductor device according to a second preferred embodiment of the present invention. The second preferred embodiment of a method for fabricating a semiconductor device can be used, for example, to form the first preferred embodiment according to the present invention.

Figure 4A:
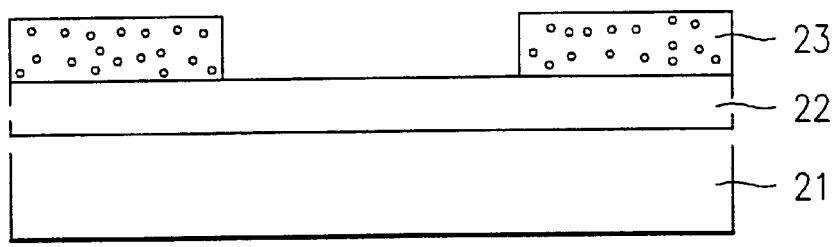
FIGS. 4a to 4h are diagrams illustrating sectional views of a preferred embodiment of a method for fabricating a semiconductor device according to the present invention.

As shown in FIG. 4a, a nitride film ($Si_3N_4$) 22 is formed on the semiconductor substrate 21. A first photoresist 23 is deposited on the nitride film 22 and then patterned by exposure and developing processes.

Figure 4B:
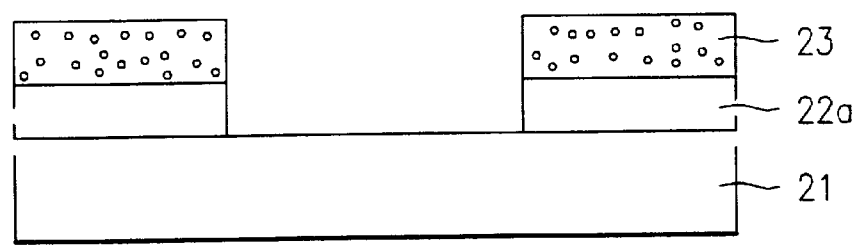

As shown in FIG. 4b, the nitride film 22 is selectively removed using the patterned first photoresist 23 as a mask to form a nitride film pattern 22a having a prescribed size.

Figure 4C:
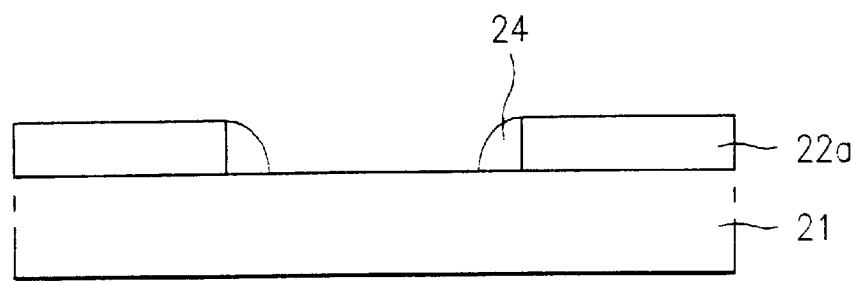

As shown in FIG. 4c, the first photoresist 23 is removed, and an oxide film is formed on the entire surface of the semiconductor substrate 21 including the nitride film pattern 22a. The oxide film is then etched back to form an sidewall oxide film 24 at sides of the nitride film pattern 22a.

Figure 4D:
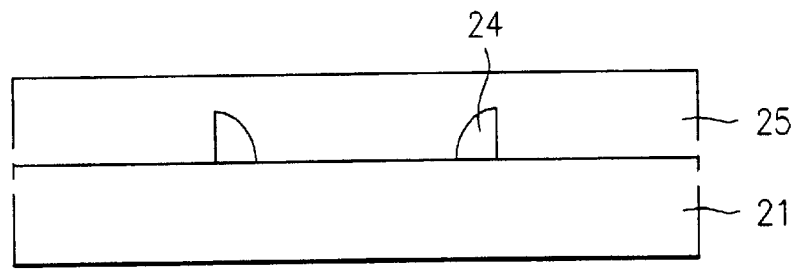

As shown in FIG. 4d, the nitride film pattern 22a is removed, and the semiconductor substrate 21 is epitaxially grown to form a p type silicon epitaxial layer 25 on the entire surface of the semiconductor substrate 21 including the sidewall oxide film 24. The sidewall oxide film 24 is preferably completely buried by the silicon epitaxial layer 25.

Figure 4E:
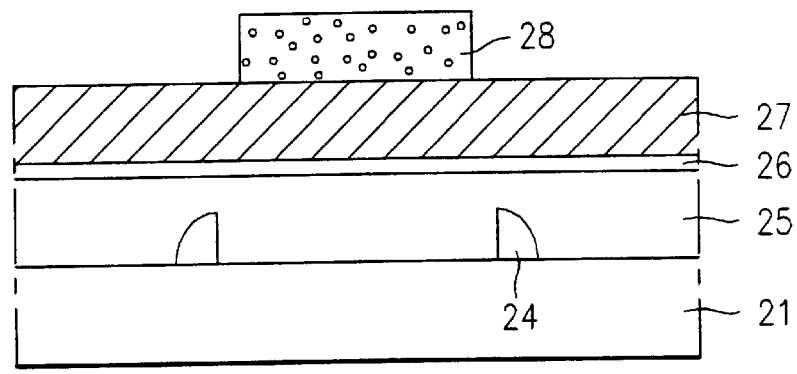

As shown in FIG. 4e, a gate insulating film 26 is formed on the silicon epitaxial layer 25, and a polysilicon layer 27 for a gate electrode is formed on the gate insulating film 26. Subsequently, a second photoresist 28 is deposited on the polysilicon layer 27 and then patterned by exposure and developing processes to define a gate region.

Figure 4F:
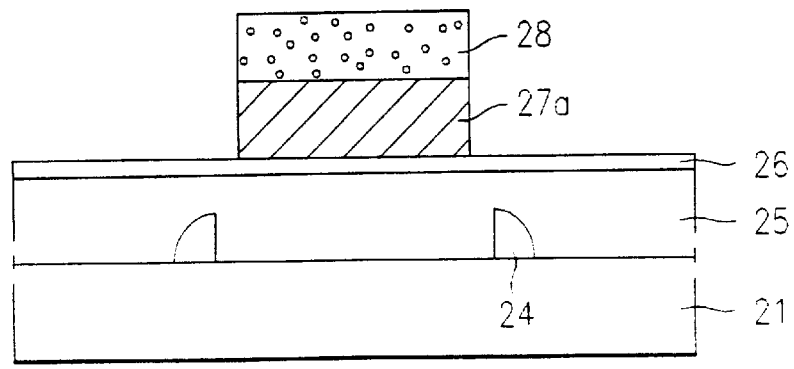
Figure 4G:
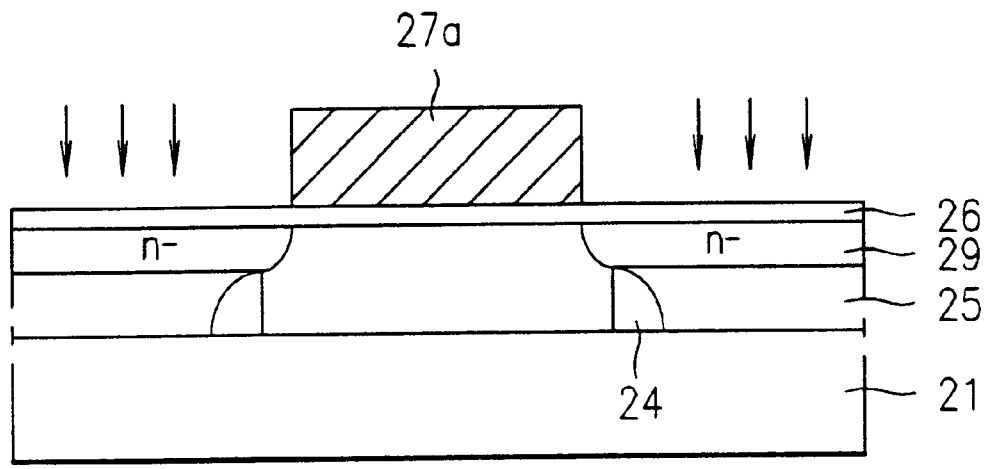

As shown in FIG. 4f, the polysilicon layer 27 is selectively removed using the patterned second photoresist 28 as a mask to form a gate electrode 27a on the gate insulating film 26 between each (e.g., pair) of the sidewall oxide film 24. As shown in FIG. 4g, the second photoresist 28 is preferably removed. Then, an n type lightly doped impurity ion is implanted into the entire surface of the semiconductor substrate 21 using the gate electrode 27a as a mask to form a lightly doped impurity region 29 in the surface of the silicon epitaxial layer 25 at both sides of the gate electrode 27a.

Figure 4H:
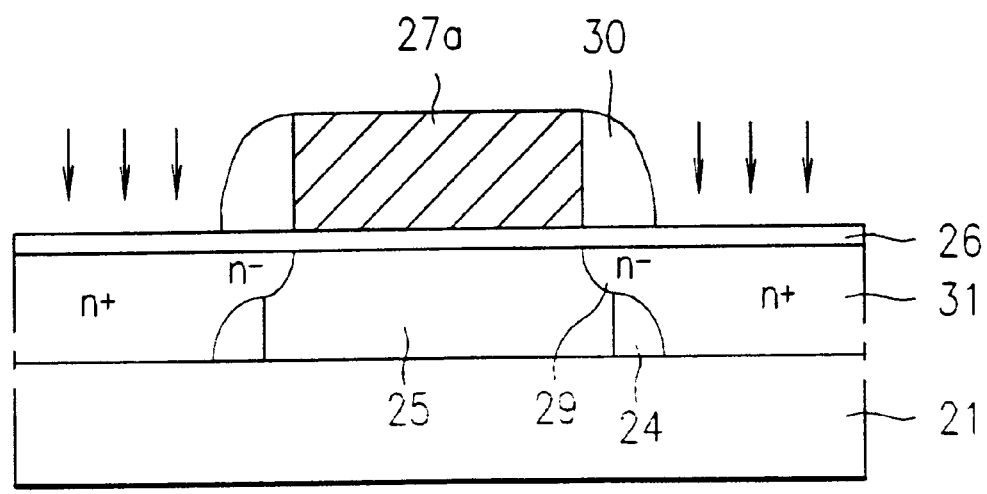

As shown in FIG. 4h, an insulating film (not shown) is formed on the entire surface of the semiconductor substrate 21 including the gate electrode 27a. The insulating film is then etched back to form a sidewall insulating film 30 at both sides of the gate electrode 27a. Subsequently, an n type heavily doped impurity ion, which is preferably used for source and drain regions, is implanted into the entire surface of the semiconductor substrate 21 using the sidewall insulating film 30 and the gate electrode 27a as masks to form a heavily doped impurity region 31 in the surface of the silicon epitaxial layer 25 at both sides of the gate electrode 27a extending from the sidewall insulating film 30. The heavily doped impurity region 31 is connected with the lightly doped impurity region 29 and isolated from each other by the sidewall oxide film 24.

Figure 5A:
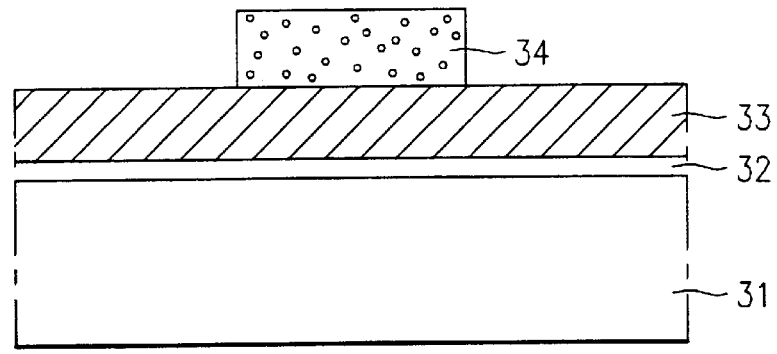
FIGS. 5a to 5f are diagrams illustrating sectional views of another preferred embodiment of a method for fabricating a semiconductor device according to the present invention.

FIGS. 5a to 5f are diagrams illustrating sectional views of process steps of a method for fabricating a semiconductor device according to a third preferred embodiment of the present invention. As shown in FIG. 5a, a gate insulating film 32 is formed on a semiconductor substrate 31, and a polysilicon layer 33 for a gate electrode is formed on the gate insulating film 32. Subsequently, a photoresist 34 is deposited on the polysilicon layer 33 and then patterned by exposure and developing processes to define a gate region.

Figure 5B:
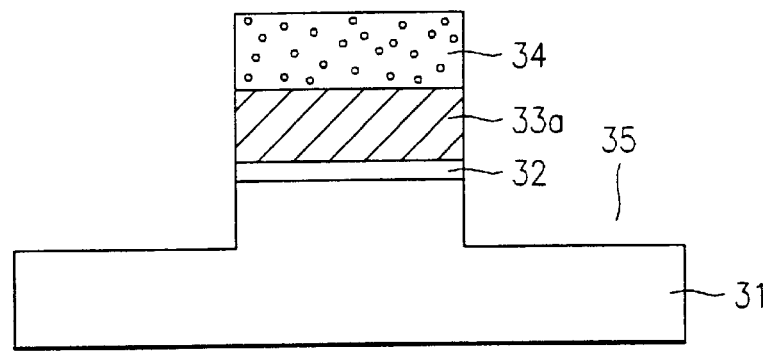

As shown in FIG. 5b, the polysilicon layer 33 and the gate insulating film 32 are selectively removed using the patterned photoresist 34 as a mask to form a gate electrode 33a. At this time, the polysilicon layer 33 and the gate insulating film 32 are preferably overetched to form a trench 35 with a predetermined depth from a surface of the semiconductor substrate 31.

Figure 5C:
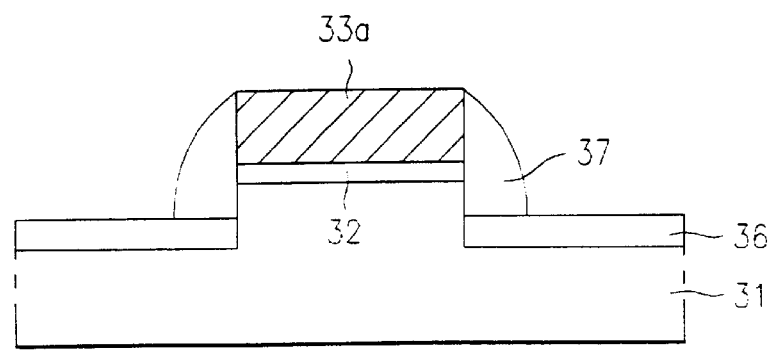

As shown in FIG. 5c, the photoresist 34 is removed, and an oxide film 36 is formed on the surface of the semiconductor substrate 31 in which the trench 35 is formed. Subsequently, a first insulating film (not shown) is formed on the entire surface of the semiconductor substrate 31 including the gate electrode 33a. The first insulating film is then etched back to form a first sidewall insulating film 37 at sides of the gate electrode 33a, the gate insulating film 32, and the trench 35.

Figure 5D:
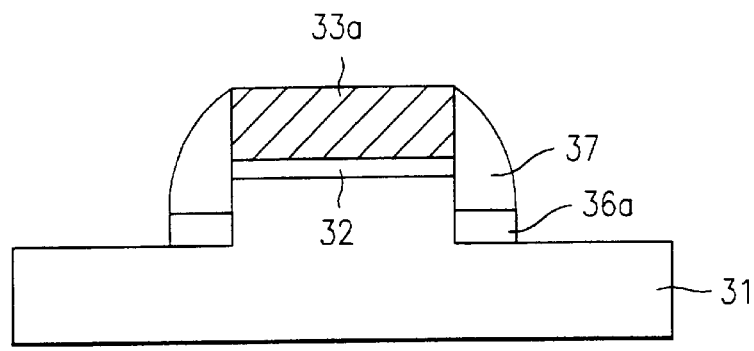

As shown in FIG. 5d, the oxide film 36 is selectively removed using the first sidewall insulating film 37 and the gate electrode 33a as masks to form an oxide film pattern 36a.

Figure 5E:
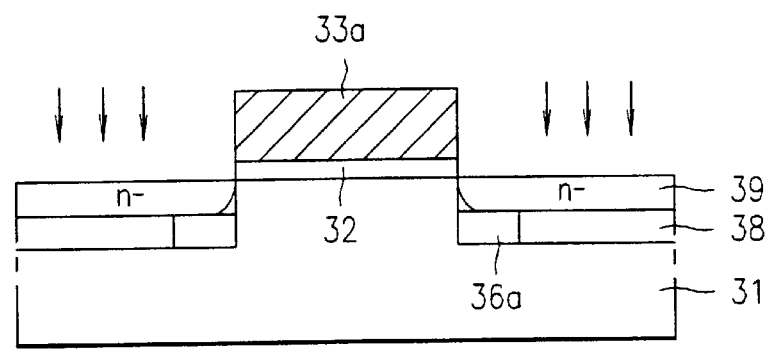

As shown in FIG. 5e, the first sidewall insulating film 37 is removed, and a silicon epitaxial layer 38 is formed using the semiconductor substrate 31 as a seed. The silicon epitaxial layer 38 is preferably formed so that the oxide film pattern 36a is fully buried. Subsequently, an n type lightly doped impurity ion is implanted into the entire surface of the semiconductor substrate 31 using the gate electrode 33a as a mask to form a lightly doped impurity region 39 in a surface of the silicon epitaxial layer 38 at both sides of the gate electrode 33a.

Figure 5F:
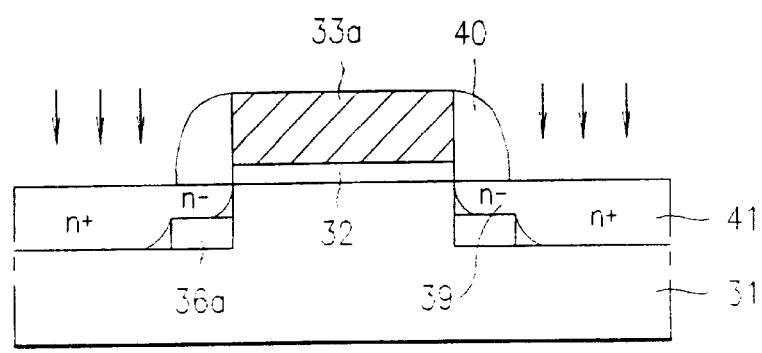

As shown in FIG. 5f, a second insulating film (not shown) is formed on the entire surface of the semiconductor substrate 31 including the gate electrode 33a. The second insulating film is then etched back to form a second sidewall insulating film 40 at both sides of the gate electrode 33a. Subsequently, an n type heavily doped impurity ion for a source and a drain is implanted into the entire surface of the semiconductor substrate 31 using the second sidewall insulating film 40 and the gate electrode 33a as masks to form a heavily doped impurity region 41 in the surface of the silicon epitaxial layer 38 at both sides of the gate electrode 33a. The heavily doped impurity region 41 is connected with the lightly doped impurity region 39 and isolated from each other by the oxide film pattern 36a.

As described above, the preferred embodiments of a semiconductor device and a method for fabricating the same according to the present invention have various advantages. An insulating film according to the preferred embodiments is formed at sides of the heavily doped impurity region to prevent the impurity ion from being diffused into the channel region. The insulating film of the preferred embodiments improves a device short channel effect characteristic.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method for fabricating a semiconductor device comprising the steps of:

forming insulating films on a semiconductor substrate having prescribed dimensions and separated by a prescribed distance;

forming a semiconductor layer on an entire surface of the semiconductor substrate including the insulating films;

forming a gate over the semiconductor substrate between pairs of the insulating films;

forming a lightly doped impurity region in a surface of the semiconductor layer at both sides of the gate;

forming a first sidewall insulating film at both sides of the gate; and forming heavily doped impurity regions in the semiconductor layer at both sides of the first sidewall insulating film, the heavily doped impurity regions being isolated from each other by the insulating film.

2. The method of claim 1, wherein the forming the gate step comprises:

forming a gate insulating film over the semiconductor substrate; and forming a gate electrode on the gate insulating film.

3. The method of claim 1, wherein the lightly doped region is between the first sidewall insulating film and the insulating films, and wherein the first sidewall insulating film contacts an upper surface of the lightly doped impurity regions and the insulating films contact a bottom surface of the lightly doped impurity regions.

4. The method of claim 1, wherein the insulating films are an oxide film, and wherein the heavily doped impurity regions are formed by ion-implantation using the first sidewall insulating film and the gate as a mask.

5. The method of claim 1, wherein the semiconductor layer is epitaxially grown using the semiconductor substrate as a seed.

6. The method of claim 1, wherein the forming the insulating films step comprises:

etching the semiconductor substrate at both sides of the gate to a predetermined depth from a top surface to form a trench;

forming an initial insulating film on the surface of the semiconductor substrate in which the trench is formed;

forming a second sidewall insulating film at both sides of the gate and the trench;

selectively removing the initial insulating film using the gate and the second sidewall insulating film as masks to form the insulating films; and removing the second sidewall insulating film.

7. The method of claim 1, wherein the gate is formed on the semiconductor layer over the semiconductor substrate.

8. The method of claim 1, wherein the forming the insulating films step comprises:

forming a patterned layer on the semiconductor substrate;

forming a second sidewall insulating film at sides of the patterned insulating layer; and removing the patterned layer.

9. A method for fabricating a semiconductor device comprising the steps of:

forming a gate insulating film and a gate electrode on a semiconductor substrate;

etching the semiconductor substrate at both sides of the gate electrode to a predetermined depth from a top surface to form a trench;

forming an insulating film on the semiconductor substrate in the trench;

forming a first sidewall insulating film at both sides of the gate electrode, the gate insulating film and the trench;

selectively removing portions of the insulating film using the gate electrode and the first sidewall insulating film as masks;

removing the first sidewall insulating film;

forming a semiconductor layer on the entire surface of the semiconductor substrate including the insulating film; and forming heavily doped impurity regions in the semiconductor layer at both sides of the gate electrode, wherein the heavily doped impurity regions are isolated from each other by the insulating film.

10. The method of claim 9, further comprising:

forming a lightly doped impurity region in a surface of the semiconductor layer at both sides of the gate electrode; and forming a second sidewall insulating film at both sides of the gate electrode, wherein the heavily doped impurity regions are formed by ion-implantation using the second sidewall insulating film and the gate as a mask.

11. The method of claim 10, wherein the insulating films are an oxide film, where in the lightly doped region is between the second sidewall insulating film and the insulating film, and wherein the second sidewall insulating film contacts an upper surface of the lightly doped region and the insulating film contacts a bottom surface of the lightly doped region.

12. The method of claim 9, wherein the semiconductor layer is epitaxially grown using the semiconductor substrate as a seed.

13. The method of claim 9, wherein the trench is formed by overetching the gate electrode.

14. The method of claim 9, wherein the heavily doped impurity regions are formed in a surface of the semiconductor layer.

* * * * *